(12) United States Patent
Norwood

(10) Patent No.:  US 12,658,672 B2
(45) Date of Patent:  Jun. 16, 2026

(54) LASER SYSTEM AND METHOD FOR DRIVING A LASER SYSTEM

(71) Applicant: Endress+Hauser Optical Analysis, Inc., Ann Arbor, MI (US)

(72) Inventor: Timothy Norwood, Chelsea, MI (US)

(73) Assignee: Endress+Hauser Optical Analysis, Inc., Ann Arbor, MI (US)

( * ) Notice: Subject to any disclaimer, the term of this patent is extended or adjusted under 35 U.S.C. 154(b) by 792 days.

(21) Appl. No.: 17/808,310

(22) Filed: Jun. 23, 2022

(65) Prior Publication Data

US 2023/0420914 A1      Dec. 28, 2023

(51) Int. Cl.
*H01S 5/0683*      (2006.01)
*H01S 5/0239*      (2021.01)
*H01S 5/026*      (2006.01)
*H01S 5/06*      (2006.01)
*H01S 5/068*      (2006.01)

(52) U.S. Cl.
CPC ........ *H01S 5/06808* (2013.01); *H01S 5/0262* (2013.01); *H01S 5/0617* (2013.01); *H01S 5/0683* (2013.01); *H01S 5/0239* (2021.01)

(58) Field of Classification Search
CPC ..... H01S 5/0683; H01S 5/0239; H01S 5/0617
See application file for complete search history.

(56) References Cited

U.S. PATENT DOCUMENTS

2004/0136420 A1* 7/2004 Robinson ................ H01S 5/042
                                                              372/34
2010/0158055 A1* 6/2010 Giebel ............... G06K 7/10584
                                                              372/29.011
2011/0236028 A1* 9/2011 Liu ...................... H04B 10/564
                                                              398/136
2012/0106953 A1* 5/2012 Nguyen ............. H01S 5/06832
                                                              398/38
2012/0245571 A1* 9/2012 Mordaunt ............. H01S 5/0014
                                                              606/4

FOREIGN PATENT DOCUMENTS

EP          3901655 A1   10/2021

* cited by examiner

*Primary Examiner* — Michael Carter
(74) *Attorney, Agent, or Firm* — Mark A. Logan; Endress+Hauser (USA) Holding, Inc.

(57)          ABSTRACT
The present disclosure includes a method for driving a laser system, wherein the laser system includes: at least one laser diode arranged for light emission; an electronic circuit configured for driving the laser diode by applying an electric drive current; and a power sensor arrangement including at least one power sensor for measuring an optical power output, wherein the method includes: applying and maintaining the electric drive current to the at least one laser diode at a setpoint; determining measurement values of a current optical power output by the power sensor arrangement; comparing the measurement values of the current optical power output with a target optical power output; and adjusting and maintaining the electric drive current at a new setpoint when an absolute value of a difference between the target optical power output and the current optical power output crosses a threshold.

9 Claims, 3 Drawing Sheets

100

101 — maintaining electric drive current at a setpoint

102 — determining measurement values of current optical power output

103 — comparing measurement values with target optical power output

104 — adjusting electric drive current

LASER SYSTEM AND METHOD FOR DRIVING A LASER SYSTEM

TECHNICAL FIELD

The present disclosure relates to an improved method for driving a laser system utilizing a diode laser and to a laser system applying the improved method.

BACKGROUND

Crucial to many laser systems is maintaining a constant optical power output. This may be important, for example, in the medical field, where laser light is used on sensitive organic material, or also in process industries, where power output needs to be controlled in a precise manner.

Laser systems, such as shown in EP3901655A1, apply, for example, a constant electric drive current to a laser diode. However, as laser diodes degrade over time and because their effectiveness is also sensitive to external circumstances, a constant electric current supplied to a laser diode does not guarantee constant optical power output. It is known to check optical power output with the help of optical power output sensors and to use these data for a feedback loop controlling the electric drive current. In such a conventional control scheme, the drive current may be adjusted to maintain a constant value output from the optical power output sensors. However, this conventional approach tends to the transfer signal noise of those sensors onto the optical power output of the laser diode itself.

Accordingly, there remains a need for further contributions in this area of technology.

SUMMARY

An object of the present disclosure is to provide a method for driving a laser system in a robust manner with little optical power output fluctuation over time. This object is achieved with a laser system according to the present disclosure and a method for driving a laser system according to the present disclosure.

According to the present disclosure, an inventive method for driving a laser system includes: at least one laser diode configured and arranged for light emission; an electronic circuit configured to drive the at least one laser diode by applying an electric drive current; and a power sensor arrangement including at least one power sensor configured to measure an optical power output of the at least one laser diode, the method including: applying and maintaining the electric drive current to the at least one laser diode at a setpoint; determining measurement values of a current optical power output of the at least one laser diode using the power sensor arrangement; comparing the measurement values of the current optical power output with a target optical power output; and adjusting the electric drive current to a new setpoint when an absolute value of a difference between the target optical power output and the current optical power output meets or exceeds a threshold. In such an embodiment, the electric drive current may be maintained at the new setpoint for at least a first period.

In this way, a signal noise of the power sensor arrangement is not transferred to the optical power output of the laser diode, but a feedback to the laser diode is implemented that minimizes optical power output fluctuation over time relative to conventional constant power output control schemes.

In at least one embodiment, the electronic circuit includes calibration data of the power sensor arrangement, wherein the calibration data is generated by calibrating previous measurement values against a different set of optical power output values of the at least one laser diode, and wherein the adjustment and maintenance of the electric drive current is based on the calibration data. In such an embodiment, the calibration data may be generated by ramping the optical power over a range (e.g., 0 to 500 W) while measuring and recording output from each power sensor in the power sensor arrangement. The calibration data may be stored in or as part of the electronic circuit configured for performing the remainder of the method. Generating new calibration data may be performed at any time for use in performing the remainder of the method.

In at least one embodiment, the power sensor arrangement includes a plurality of power sensors, each configured to measure a corresponding optical power output of the at least one laser diode. In certain such embodiments, a corresponding target value is set, wherein the electric drive current is adjusted when a majority of the absolute values of differences between each corresponding target values and each corresponding measured optical power output crosses a threshold. In further embodiments, the electric drive current is adjusted when a majority of the absolute values of differences between each corresponding target values and each corresponding measured optical power output crosses a threshold. In yet further embodiments, the electric drive current is adjusted when a smallest of the absolute values of differences between each corresponding target values and each corresponding measured optical power output crosses a threshold. In such embodiments, the feedback to the laser diode is more immune and robust against noise from the laser system itself.

In at least one embodiment the threshold is adjustable. In such embodiments, an influence on the power sensor arrangement and/or the at least one laser diode, such as ambient temperature, may be accounted for and compensated for accordingly.

In at least one embodiment, output data of the at least one power sensor are time averaged within a second period of at least 0.1 seconds or at least 1 second, and/or the output data of the at least one power sensor are time averaged within a period of at most 10 seconds or at most 5 seconds, wherein measurement values of the laser optical power output are calculated from the time-averaged output data. In such embodiments, noise from the power sensor arrangement may be further reduced.

In at least one embodiment, the method steps are repeated within a third period that is less than a week of runtime of the laser diode, for example, less than 48 hours of runtime, and/or wherein the third period of more than 100 milliseconds of runtime or more than one second of runtime.

In at least one embodiment, a transition between a previous setpoint and a subsequent setpoint occurs within less than a second, for example, less than 0.1 second.

In at least one embodiment, a step change to the electric drive current is implemented in terms of a step magnitude of adjustments of an electric drive current power to the at least one laser diode, and wherein the step magnitude of adjustments to the electric drive current power is less than 10 milliwatt, for example, less than 3 milliwatt, and/or wherein the step change of electric drive current power amendment of the electric drive current is more than 0.1 milliwatt, for example, more than 0.3 milliwatt.

In at least one embodiment the power sensor arrangement concludes at least one of following sensors: a photo diode sensor, a photoresistor, a photoconductor, a phototransistor, a thermopile and a microbolometer.

In at least one embodiment according to the present disclosure, an inventive laser system includes a laser diode arranged for light emission; an electronic circuit arranged for driving the laser diode by applying an electric drive current; a power sensor arrangement including at least one power sensor for measuring a laser optical power output, wherein the electronic circuit is configured to perform the method steps according to at least one embodiment of the method of the present disclosure. Such embodiments of the laser system enable a more stable laser system with a feedback loop.

In at least one embodiment, the laser system further includes a housing in which the laser diode, the electronic circuit and the power sensor arrangement are disposed.

In at least one embodiment, the at least one power sensor of the power sensor arrangement includes a plurality of power sensors, each configured to measure a corresponding optical power output of the at least one laser diode.

BRIEF DESCRIPTION OF THE DRAWINGS

The described embodiments and other features, advantages and disclosures contained herein, and the manner of attaining them, will become apparent and the present disclosure will be better understood by reference to the following description of various embodiments of the present disclosure taken in junction with the accompanying drawings, wherein.

DETAILED DESCRIPTION

Figure 1:
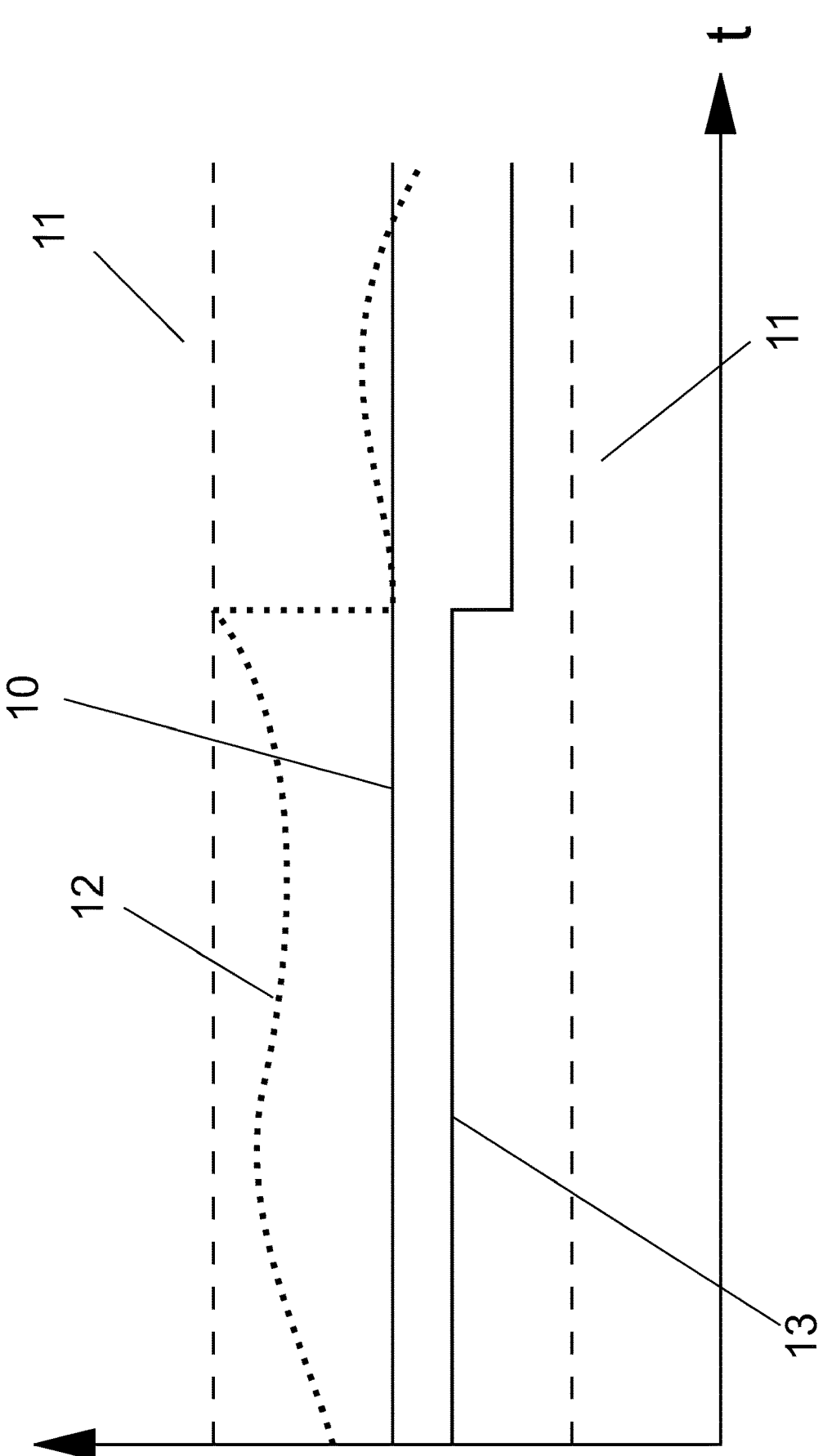
FIG. 1 illustrates exemplary variation of an optical laser output and sensor output of a laser system and illustrates an adjustment according to a method of the present disclosure.
Figure 3:
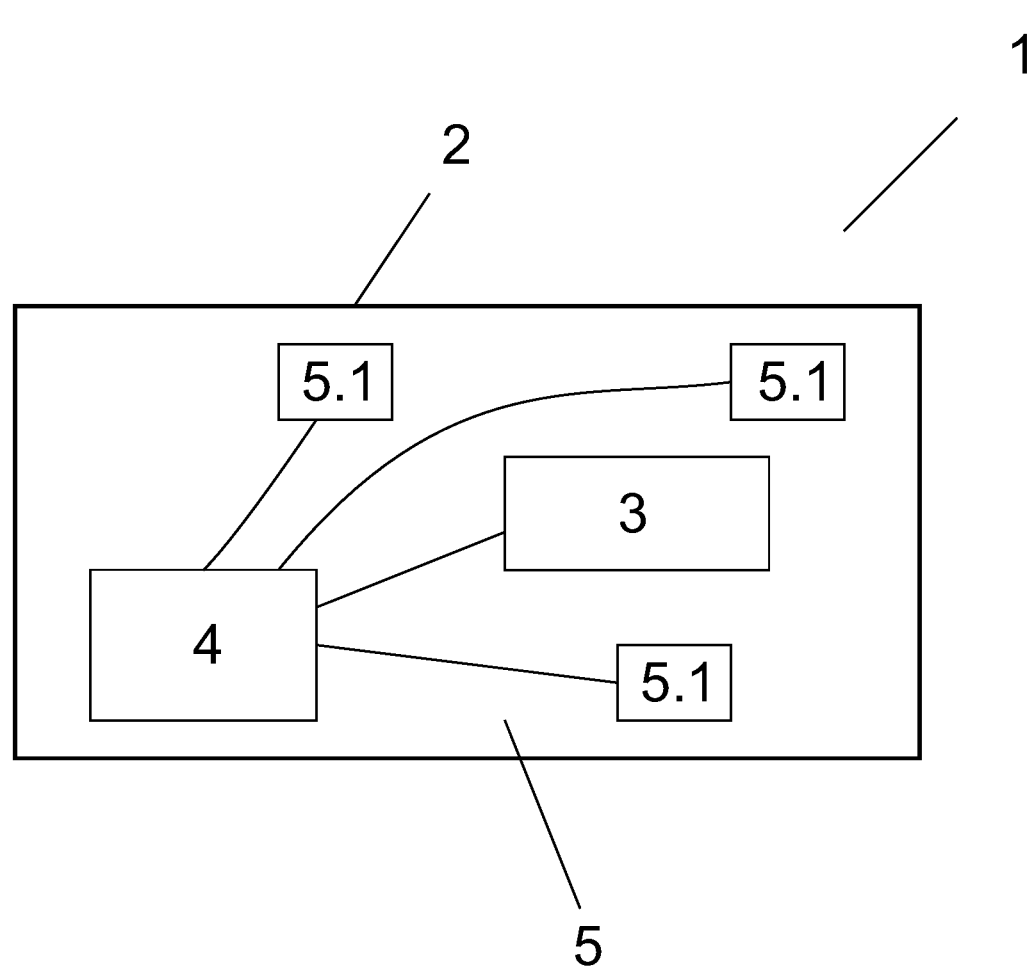
FIG. 3 shows an exemplary laser system according to the present disclosure.

FIG. 1 illustrates exemplary variation of an optical power output 12 of a laser system 1 according to the present disclosure and an electric drive current 13 of a laser diode 3 of the laser system 1 (see also FIG. 3). To keep the optical power output 12 of the laser system within a certain desired range, a power sensor arrangement 5 with at least one power sensor for measuring optical power output is installed, and thresholds 11 below and above a target optical power output 10 are set. The electric drive current 13 is set at a setpoint and kept stable and, at least in the interim, constant such that little to zero noise due to the electric drive current 13 is transferred to the laser diode 3 and, therefore, to the optical power output of the laser system 1.

Once the optical power output 12 reaches a threshold 11, the electric drive current 13 is adjusted to a new setpoint such that the optical power output 12 is well within the range defined by the thresholds 11. In this way, a good control over the optical power output 12 is achieved, as well as a reduced noise level of the optical power output 12 of the laser diode 3.

In at least one embodiment, thresholds 11 are adjustable. This adjustability may be advantageous in case of temperature fluctuations, for example.

In at least one embodiment, only one threshold 11 above the target optical power output 10 is implemented. In implementations of the laser system 1 where power fluctuations below the target optical output are not expected, a single threshold may be sufficient.

Figure 2:
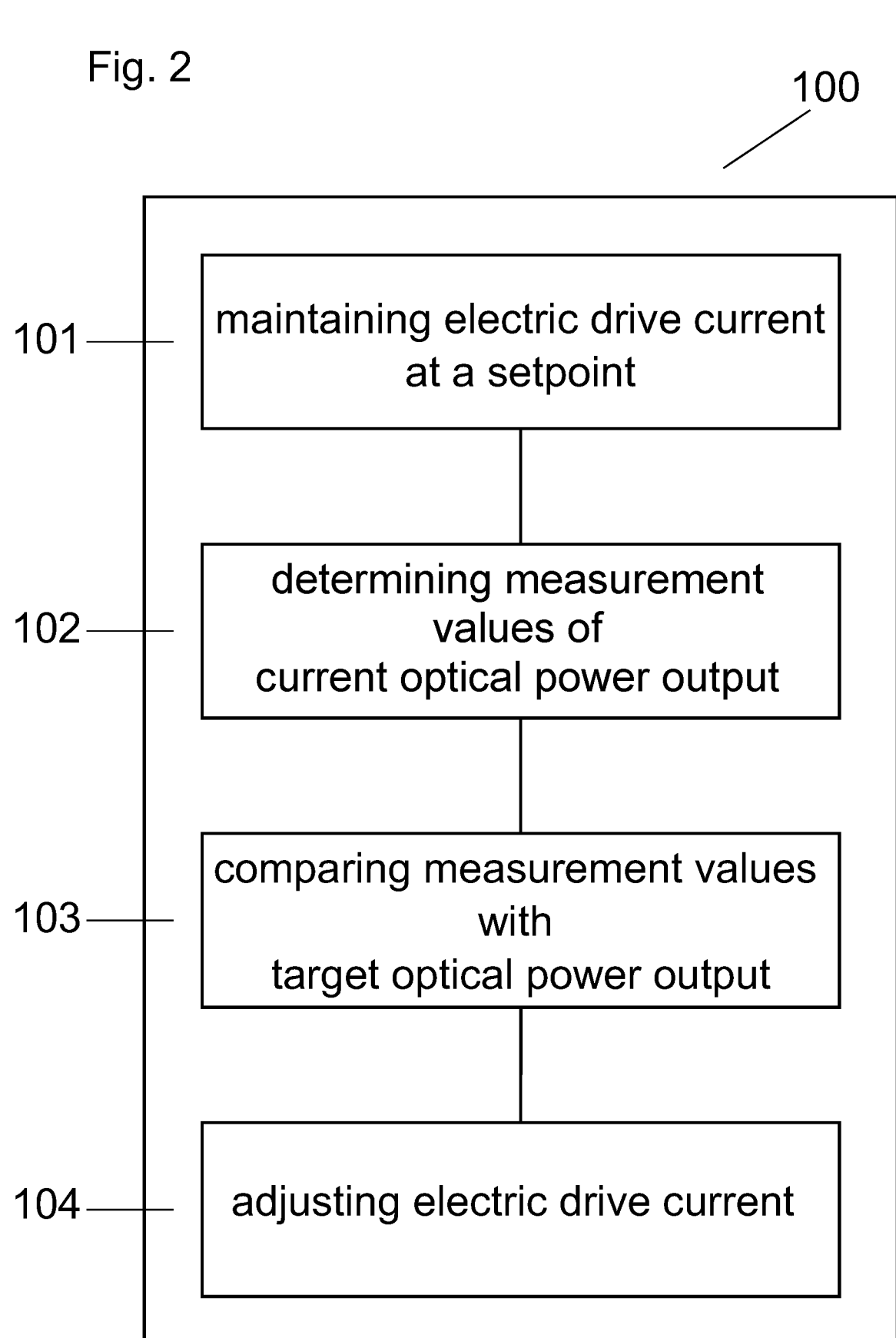
FIG. 2 shows an exemplary method according to the present disclosure.

FIG. 2 shows an exemplary embodiment of a method 100 according to the present disclosure, wherein in a method step 101, the electric drive current 13 is applied and maintained to the at least one laser diode 3 at a setpoint.

In a method step 102, measurement values of a current laser optical power output 12 are determined by the power sensor arrangement 5.

In a method step 103, the measurement values of the current optical power output 12 are compared with a target optical power output 10.

In a method step 104, the electric drive current 13 is adjusted and maintained at a new setpoint when an absolute value of a difference between the target power output 10 and the current laser optical power output 12 meets or exceeds a threshold 11.

FIG. 3 shows a schematic of a laser system 1 according to the present disclosure, which includes: a laser diode 3 configured and arranged for light emission; an electronic circuit 4 configured to drive the laser diode 3 by applying an electric drive current; a power sensor arrangement 5 including at least one power sensor 5.1 adapted to measure a laser optical power output of the laser diode 3; a housing 2 for the laser diode 3, the electronic circuit 4 and the power sensor arrangement 5, wherein the electronic circuit 3 is configured to perform the method steps according to the present disclosure.

In at least one embodiment, the power sensor arrangement 5 includes at least one of the following sensors: a photo diode, a photoresistor, a photoconductor, a phototransistor, a thermopile and a microbolometer.

The measurement values of the current laser optical power output may be generated by a power sensor arrangement 5 with one single power sensor 5.1 or with a plurality of power sensors 5.1, as shown in FIG. 3. In embodiments of the laser system 1 including a plurality of power sensors 5.1, for each power sensor 5.1, an individual, corresponding target value may be set. In such embodiments, the electric drive current may be adjusted if (e.g., when) a majority of differences between the individual target power outputs of the plurality of the power sensors 5.1 and a measured laser optical power output crosses a threshold. In a further embodiment, the electric drive current may be adjusted if a smallest difference between the target power output and the measured laser optical power output crosses a threshold. In a yet further embodiment, the electric drive current may be adjusted if a largest difference between the individual target power outputs and the measured laser optical power output crosses a threshold. In such embodiments, the threshold may include different thresholds for each given condition, for example, for the majority of differences, the smallest difference and/or the largest difference.

The target value may be set based on at least one of: the type of laser diode 3 of the laser system 1; operating parameters of the laser diode 3; recorded nominal values of the laser diode 3; and the calibration data. In certain embodiments, the threshold may be calculated, at least in part, as a percentage of or offset from the corresponding target value, for example, 1% above or below the target value. Target values may be calculated and/or set based on historical operating data of the laser diode 3 and the laser system 1, including as a non-limiting example, using machine learning algorithms to analyze laser diode 3 of the laser system 1 performance.

In at least one embodiment, optical power output data of the at least one power sensor 5.1 are time averaged within a period of at least 0.1 seconds, for example, at least 1 second. In further embodiments, the optical power output data of the at least one power sensor are time averaged within a period of at most 10 seconds, for example, at most 5 seconds. In such embodiments, the measurement values of the current optical power output be may calculated from the time-averaged output data.

Temporal averaging reduces a noise level of the output data such that the meeting or exceeding the corresponding threshold can be detected more precisely. In at least one embodiment, the method steps may be repeated within a time period equivalent to less than a week of runtime, for example, less than 48 hours of runtime. Such an upper time limit of less than a week guarantees a sufficiently responsive adjustment of the electrical drive current with relatively little energy consumption required of an electronic circuit processing and determining the adjustment.

In further embodiments, the method steps may be repeated within a time period of more than 100 milliseconds of runtime, for example, more than one second of runtime. Such a lower time limit of more than 100 milliseconds ensures accurate and very responsive adjustment of the electric drive current.

Changes of the electric drive current may be implemented and controlled in terms a power value, specifically electric drive current power. In at least one embodiment, a step magnitude of adjustments to the electric drive current power is less than 10 milliwatt, for example, less than 3 milliwatt. In further embodiments, the step magnitude of electric drive current power amendments is more than 0.1 milliwatt, for example, more than 0.3 milliwatt.

I claim:

1. A method for driving a laser system, wherein the laser system comprises:

a laser diode configured and arranged for light emission;

an electronic circuit configured to drive the laser diode by applying an electric drive current; and a power sensor arrangement comprising a plurality of power sensors, each power sensor configured to measure a corresponding optical power output of the laser diode, the method comprising:

setting, for each power sensor of the plurality of power sensors, a target optical power output for the laser diode;

setting a non-zero threshold value;

applying and maintaining the electric drive current to the laser diode at a setpoint;

measuring, at each power sensor of the plurality of power sensors, a current optical power output of the laser diode;

comparing the current optical power output measured at each power sensor of the plurality of power sensors with the corresponding target optical power output;

adjusting the electric drive current to a new setpoint when, for a majority of power sensors of the plurality of power sensors, an absolute value of a difference between the target optical power output and the current optical power output meets or exceeds the threshold value; and maintaining the electric drive current at the new setpoint for at least a first period.

2. The method of claim 1, wherein the electronic circuit comprises calibration data of the power sensor arrangement, wherein the calibration data is generated by calibrating previous measurement values against a different set of optical power output values of the laser diode, and wherein the adjustment and maintenance of the electric drive current is based on the calibration data.

3. The method of claim 1, wherein the threshold is adjustable.

4. The method of claim 1, wherein the method steps are repeated within a third period, wherein the third period is less than a week of runtime, and/or the third period is more than one second of runtime.

5. The method of claim 1, wherein a transition between a previous setpoint and a subsequent setpoint occurs within less than a second.

6. The method of claim 1, wherein a step change to the electric drive current is implemented in terms of a step magnitude of adjustments of an electric drive current power to the laser diode, and wherein the step magnitude of adjustments to the electric drive current power is less than 10 milliwatt and/or more than 0.1 milliwatt.

7. The method of claim 1, wherein the power sensor arrangement comprises at least one of: a photo diode, a photoresistor, a photoconductor, a phototransistor, a thermopile and a microbolometer.

8. A laser system comprising:

a laser diode configured and arranged for light emission;

an electronic circuit configured to drive the at least one laser diode by applying an electric drive current; and a power sensor arrangement comprising a plurality of power sensors, each power sensor configured to measure a corresponding optical power output of the laser diode, wherein the electronic circuit is configured to perform the method according to claim 1.

9. The laser system of claim 8, further comprising a housing in which the laser diode, the electronic circuit and the power sensor arrangement are disposed.

* * * * *